(12) United States Patent
Park et al.

(10) Patent No.: US 8,632,854 B2
(45) Date of Patent: Jan. 21, 2014

(54) SUBSTRATE CENTERING DEVICE AND ORGANIC MATERIAL DEPOSITION SYSTEM

(71) Applicant: Samsung Display Co., Ltd., Yongin (KR)

(72) Inventors: Jae-Mork Park, Yongin (KR); You-Min Cha, Yongin (KR); Won-Seok Cho, Yongin (KR); Jae-Hong Ahn, Yongin (KR); Min-Jeong Hwang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/942,514

(22) Filed: Jul. 15, 2013

(65) Prior Publication Data

US 2013/0302134 A1   Nov. 14, 2013

Related U.S. Application Data

(63) Continuation of application No. 12/881,759, filed on Sep. 14, 2010, now Pat. No. 8,512,473.

(30) Foreign Application Priority Data

Sep. 25, 2009   (KR) .......................... 10-2009-0091322

(51) Int. Cl.
| | | |
|---|---|---|
| *C23C 16/458* | (2006.01) | |
| *H01L 21/306* | (2006.01) | |
| *C23F 1/00* | (2006.01) | |
| *B05D 1/32* | (2006.01) | |
| *B05D 5/00* | (2006.01) | |
| *C23C 16/06* | (2006.01) | |
| *C23C 16/22* | (2006.01) | |

(52) U.S. Cl.
USPC ................. 427/282; 156/345.22; 156/345.31; 118/721; 118/213; 118/301; 118/406; 118/504; 118/719

(58) Field of Classification Search
USPC ................. 118/721, 213, 301, 406, 504, 719; 156/345.22, 345.31; 427/282
See application file for complete search history.

(56) References Cited

U.S. PATENT DOCUMENTS

| | | | |
|---|---|---|---|
| 4,036,171 A | * | 7/1977 | Ramet ........................... 118/720 |
| 6,327,034 B1 | * | 12/2001 | Hoover et al. ................ 356/400 |
| 7,670,437 B2 | * | 3/2010 | Allen et al. ................... 118/729 |

(Continued)

FOREIGN PATENT DOCUMENTS

| | | |
|---|---|---|
| JP | 4178249 | 9/2008 |
| KR | 10-1991-0003142 | 2/1991 |

(Continued)

*Primary Examiner* — Rudy Zervigon
(74) *Attorney, Agent, or Firm* — Robert E. Bushnell, Esq.

(57) ABSTRACT

A substrate centering device for an organic material deposition system comprises: a plurality of substrate support holders configured to be reciprocally movable in a facing direction within an organic material deposition chamber and supporting both side portions of a substrate loaded by a robot; a substrate centering unit configured to be reciprocally movable at each of the substrate support holders and centering the substrate by guiding both side portions of the substrate; and a plurality of substrate clampers configured to be reciprocally movable in a vertical direction at each of the substrate support holders, and clamping the substrate that has been centered by the substrate centering unit.

15 Claims, 9 Drawing Sheets

(56) References Cited

U.S. PATENT DOCUMENTS

| | | | |
|---|---|---|---|
| 7,938,907 B2 * | 5/2011 | Puech et al. | 118/720 |
| 7,993,461 B2 * | 8/2011 | Endo et al. | 118/728 |
| 2001/0030747 A1 * | 10/2001 | Hoover et al. | 356/400 |
| 2002/0153676 A1 * | 10/2002 | Noguchi | 279/106 |
| 2005/0053720 A1 * | 3/2005 | Yamazaki et al. | 427/69 |
| 2005/0100681 A1 * | 5/2005 | Kobayashi et al. | 427/427.1 |
| 2008/0202421 A1 * | 8/2008 | Allen et al. | 118/720 |
| 2009/0325340 A1 | 12/2009 | Aslami | |
| 2011/0073042 A1 * | 3/2011 | Park et al. | 118/729 |

FOREIGN PATENT DOCUMENTS

| | | |
|---|---|---|
| KR | 10-1997-0018000 | 4/1997 |
| KR | 10-2000-0061202 | 10/2000 |
| KR | 10-2003-0095580 | 12/2003 |
| KR | 10-2006-0028628 | 3/2006 |
| KR | 10-2009-0050755 | 5/2009 |

* cited by examiner

SUBSTRATE CENTERING DEVICE AND ORGANIC MATERIAL DEPOSITION SYSTEM

CROSS-REFERENCE TO RELATED APPLICATIONS AND CLAIM OF PRIORITY

This application is a continuation application of the prior application Ser. No. 12/881,759 filed in the U.S. Patent & Trademark Office on 14 Sep. 2010 and assigned to the assignee of the present invention. Furthermore, this application makes reference to, incorporates the same herein, and claims all benefits accruing under 35 U.S.C §119 from an application earlier filed in the Korean intellectual property Office on 25 Sep. 2009 and there duly assigned Serial No. 10-2009-0091322.

BACKGROUND OF THE INVENTION

1. Field of the Invention

The described technology relates generally to an organic material deposition system, and more particularly, to a substrate centering device for centering a substrate on which an organic material is to be deposited.

2. Description of the Related Art

In general, in order to fabricate a flat panel display device such as an organic light emitting diode (OLED) display device, an organic thin film deposition process is performed to deposit an organic material on a substrate made of glass (referred to as a "glass substrate" hereinafter). An organic material deposition system may perform the organic thin film deposition process. The organic material deposition system may include a substrate centering device for centering a glass substrate to a pre-set location within a vacuum chamber after the glass substrate is introduced to the interior of the vacuum chamber.

SUMMARY OF THE INVENTION

It is therefore one aspect for the present invention to provide an improved organic material deposition system.

It is another aspect to provide an improved substrate centering device of the organic material deposition system having advantages of preventing a glass substrate from being damaged by a physical force in a deposition process, and an organic material deposition system having the same.

An exemplary embodiment provides a substrate centering device for an organic material deposition system, including a plurality of substrate support holders configured to be reciprocally movable in a facing direction within an organic material deposition chamber, i.e., the substrate support holders moving toward or away from the substrate in a horizontal direction with respect to the substrate, and supporting both side portions of a substrate loaded by a robot; a substrate centering unit configured to be reciprocally movable at each of the substrate support holders and centering the substrate by guiding both side portions of the substrate; and a plurality of substrate clampers configured to be reciprocally movable in a vertical direction at each of the substrate support holders, and clamping the substrate that has been centered by the substrate centering unit.

When the substrate is introduced to the interior of the organic material deposition chamber, the substrate support holders may move forward to both side portions of the substrate in a state of having been moved backward.

When the substrate is loaded on the substrate support holders, the substrate centering unit may move forward to both side portions of the substrate in a state of having been moved backward.

The substrate centering device may further include an operation unit configured at the substrate support holder and the organic material deposition chamber and reciprocally moving the substrate centering unit.

The substrate centering unit may include a moving member installed to be reciprocally movable at the substrate support holder; and a roller member rotatably mounted at the moving member and rollingly brought into contact with both side portions of the substrates.

The substrate centering unit may further include at least one return spring installed to be connected with the substrate support holder and the moving member.

The operation unit may include an operation cylinder mounted in a vertical direction in the organic material deposition chamber; a pressure member installed to be connected with an operation rod of the operation cylinder; and a cam link rotatably installed on the substrate support holder, pressurized by the pressure member in accordance with an operation of the operation cylinder, and brought into cam-contact with the moving member.

The operation cylinder may be formed as a pneumatic cylinder operating by pneumatic pressure.

The substrate centering unit may include a pair of stopper members mounted on the moving member and limiting the reciprocal movement distance of the moving member with respect to the substrate support holder.

The stopper members may be configured as stopper bolts.

The substrate centering device may further include a driving unit formed in the organic material deposition chamber and reciprocally moving the substrate support holder.

The driving unit may include a guider installed in the organic material deposition chamber, to which the substrate support holder is coupled to be reciprocally movable; and a servo motor configured to be connected with the substrate support holder within the organic material deposition chamber and providing driving power to the substrate support holder.

Another embodiment provides an organic material deposition system including an organic material deposition chamber; a substrate centering device configured in the organic material deposition chamber and centering a substrate loaded by a robot; a substrate fixing holder configured in the organic material deposition chamber and fixing the substrate; and a mask holder fixing a mask at a lower side of the substrate fixing holder and configured to ascend and descend in the organic material deposition chamber, wherein the substrate centering device includes a plurality of substrate support holders configured to be reciprocally movable in a facing direction within an organic material deposition chamber, a substrate centering unit configured to be reciprocally movable at each of the substrate support holders, and a plurality of substrate clampers configured to be reciprocally movable in a vertical direction at each of the substrate support holders.

The substrate centering device may include an operation unit configured at the substrate support holder and the organic material deposition chamber and reciprocally moving the substrate centering unit.

The substrate centering unit may include: a moving member installed to be reciprocally movable at the substrate support holder; a roller member rotatably mounted on the moving member and rollingly brought into contact with both sides of the substrate; and at least one return spring installed to be connected with the substrate support holder and the moving member.

The substrate centering unit may include a pair of stopper members mounted on the moving member and limiting a reciprocal movement distance of the moving member with respect to the substrate support holder.

The operation unit may include: an operation cylinder mounted in a vertical direction in the organic material deposition chamber; a pressure member installed to be connected with an operation rod of the operation cylinder; and a cam link rotatably installed on the substrate support holder, pressurized by the pressure member according to an operation of the operation cylinder, and brought into cam-contact with the moving member.

In the substrate centering device and the organic material deposition system having the same according to exemplary embodiments, when the substrate that has been introduced into the organic material deposition chamber by a robot is centered, even if a teaching adjustment by the robot is not accurately made or even if the loaded location of the substrate with respect to the substrate support holder changes due to an external force, a collision between the roller member and the substrate can be prevented because the roller member has been moved backward by the moving member.

Thus, damage to the substrate due to a collision between the roller member and the substrate according to a change in the loaded location of the substrate can be prevented.

Also, when the loaded location of the substrate is changed, the occurrence of a phenomenon that the substrate gets on the roller member or the like can be prevented, preventing damage to the substrate according to the clamping operation of the substrate clampers.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
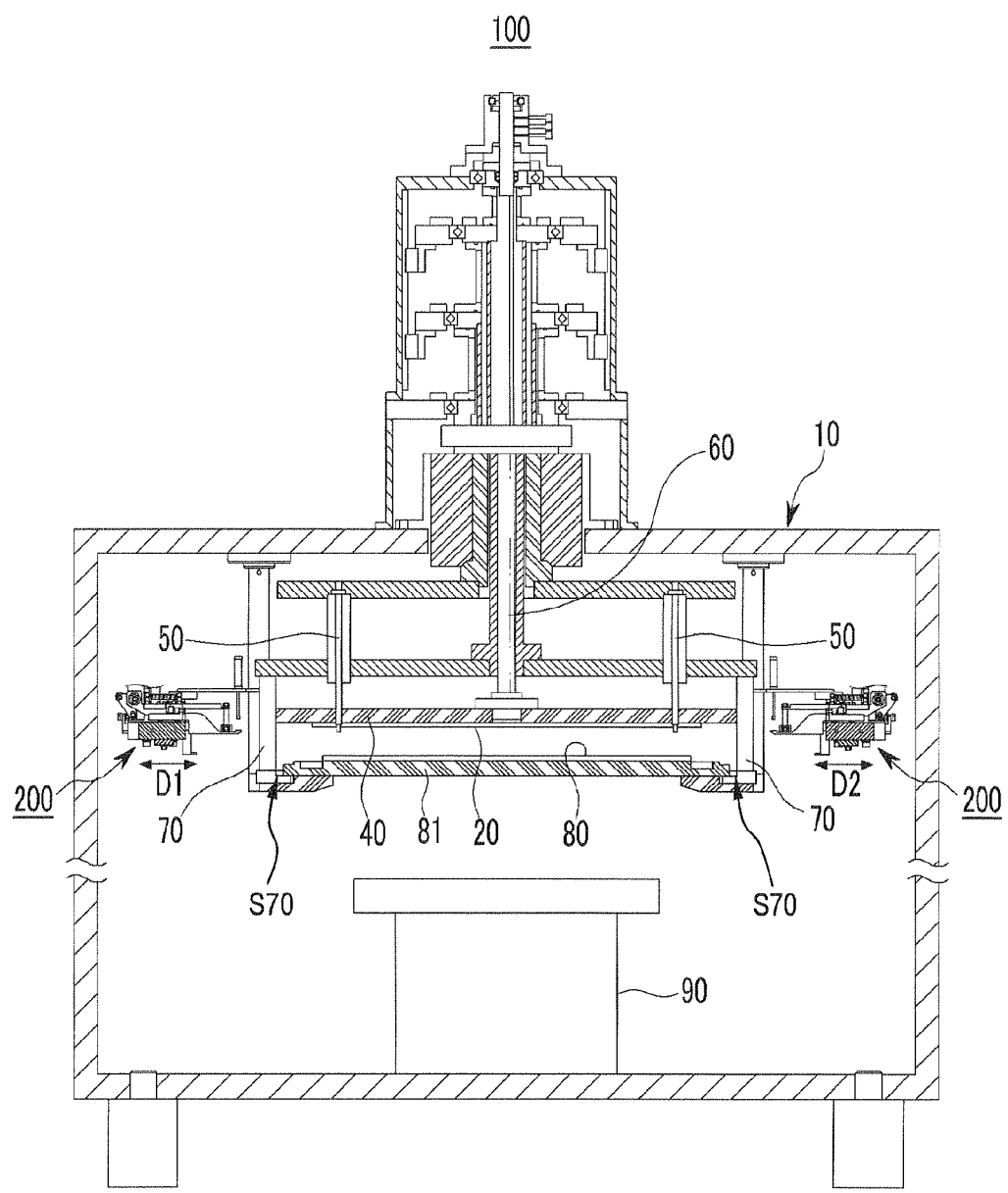
FIG. 1 is a schematic view schematically showing the configuration of an organic material deposition system constructed as an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify the present invention, parts that are not connected with the description will be omitted, and the same elements or equivalents are referred to by the same reference numerals throughout the specification.

The size and thickness of each element are arbitrarily shown in the drawings, and the present invention is not necessarily limited thereto.

In the drawings, the thickness of layers, films, panels, regions, etc., are exaggerated for clarity. Also, in the drawings, the thickness of some layers and regions are exaggerated for the sake of brevity. It will be understood that when an element such as a layer, film, region, or substrate is referred to as being "on" another element, it can be directly on the other element or intervening elements may also be present.

An organic material deposition system performing the organic thin film deposition process evaporates the organic material, that is, the organic thin film material, with respect to the glass substrate and a mask combined therewith within a vacuum chamber in order to form an organic thin film with a certain pattern on the glass substrate.

The organic material deposition system includes a substrate centering device for centering the glass substrate to a pre-set location within the vacuum chamber after the glass substrate is introduced to the interior of the vacuum chamber by means of a robot.

In this case, however, there is a possibility that, within the organic material deposition system, the glass substrate may be damaged by an external physical force or by a collision between members constituting the organic material deposition system.

The above information disclosed is only for enhancement of understanding of the background of the described technology and therefore it may contain information that does not form the prior art that is already known in this country to a person of ordinary skill in the art.

FIG. 1 is a view schematically showing the configuration of an organic material deposition system constructed as an exemplary embodiment.

With reference to FIG. 1, the organic material deposition system 100 constructed as an exemplary embodiment is for depositing an organic thin film pattern on a substrate made of glass (referred to as "glass substrate" hereinafter) in accordance with a vacuum deposition method when fabricating a flat panel display such as an organic light emitting diode (OLED) display device.

Here, the vacuum deposition method refers to a method of forming an organic thin film of a certain pattern on the glass substrate by evaporating an organic material, an organic thin film material, through a heat evaporation source 90 in a vacuum state.

The organic material deposition system 100 includes an organic material deposition chamber 10, a substrate centering device 200, a substrate fixing holder 50, and a mask holder 70. These elements will now be described.

In the present exemplary embodiment, the organic material deposition chamber 10 is configured as a vacuum chamber creating a vacuum atmosphere, which includes a heat deposition source (not shown) as mentioned above installed therein and a gate (not shown) allowing the glass substrate 20 to be carried in and out therethrough.

The organic material deposition chamber 10 further includes various motors for driving the system 100, a pump unit, a high pressure air unit, a vacuum creation unit, a heater unit, an electronic control unit, and the like.

Various components of the organic material deposition system 100 constructed as an exemplary embodiment as described hereinafter are formed in the organic material deposition chamber 10, and various brackets, a block, a plate, a housing, a cover, a bar, a collar, and the like, are adjunct elements for installing the various components in the organic material deposition chamber 10.

Thus, in the following description, these adjunct elements will be collectively called the organic material deposition chamber 10 in all but exceptions.

In the present exemplary embodiment, the substrate centering device 200 serves to load a glass substrate 20, which has been introduced into the interior of the organic material deposition chamber 10, and adjusts a centering location of the glass substrate 20 by means of a robot (not shown).

The configuration of the substrate centering device 200 constructed as an exemplary embodiment will be described in detail later with reference to FIGS. 2 through 5.

In the present exemplary embodiment, the substrate fixing holder 50 holds and fixes the substrate 20 that has been adjusted to be centered by the substrate centering device 200.

The substrate fixing holder 50 is formed to be connected with a shaft 60 disposed at the internal center from an upper portion of the organic material deposition chamber 10, and makes a vertical movement and a rotational movement through the shaft 60.

The substrate fixing holder 50 has a plate shape with a hole formed at its central portion. The glass substrate 20 is mounted at the step portion. The substrate fixing holder 50 may have a circular plan view but is not limited thereto.

Here, a pressure holder (not shown) with a general structure is installed at an upper side of the substrate fixing holder 50 in order to pressurize the glass substrate 20 mounted on the substrate fixing holder 50.

In the present exemplary embodiment, the mask holder 70 fixes a mask 80 serving as a shielding means for forming an organic thin film with a certain pattern on the glass substrate 20.

The mask holder 70 is configured to ascend and descend at a lower side of the substrate fixing holder 50 in the organic material deposition chamber 10, has a plate shape with a hole formed at its central portion, and includes a step S70 formed at a portion where an upper surface and an inner side surface are in contact. The mask holder 70 may have a rectangular plan view.

Here, the mask 80 is welded on a mask frame 81 that is mounted at the step portion of the mask holder 70.

Reference numeral 40 in FIG. 1 denotes a magnet plate disposed on the glass substrate 20 mounted at the substrate fixing holder 50 to couple the glass substrate 20 and the mask 80 in the organic material deposition chamber 10. A recessed portion may be formed on the side wall of the magnet plate 40. The substrate fixing holder 50 may move along the recessed portion to press the substrate 20 downward.

The organic material deposition chamber 10, the substrate fixing holder 50, and the mask holder 70 constructed as the present exemplary embodiment as stated above are pertinent to a contemporary technique, so a detailed description thereof will be omitted.

The configuration of the substrate centering device 200 constructed as an exemplary embodiment as mentioned above will now be described in detail with reference to FIGS. 2 through 5.

Figure 2:
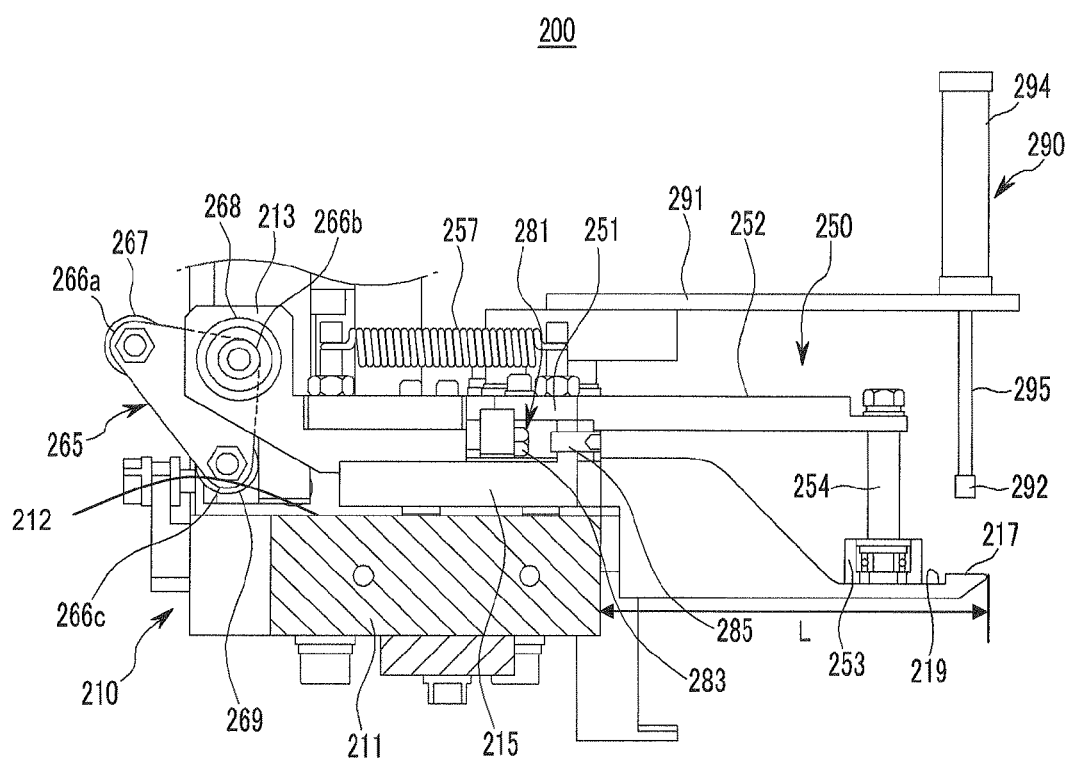
FIG. 2 is a front view of a substrate centering device for the organic material deposition system constructed as an exemplary embodiment.
Figure 3:
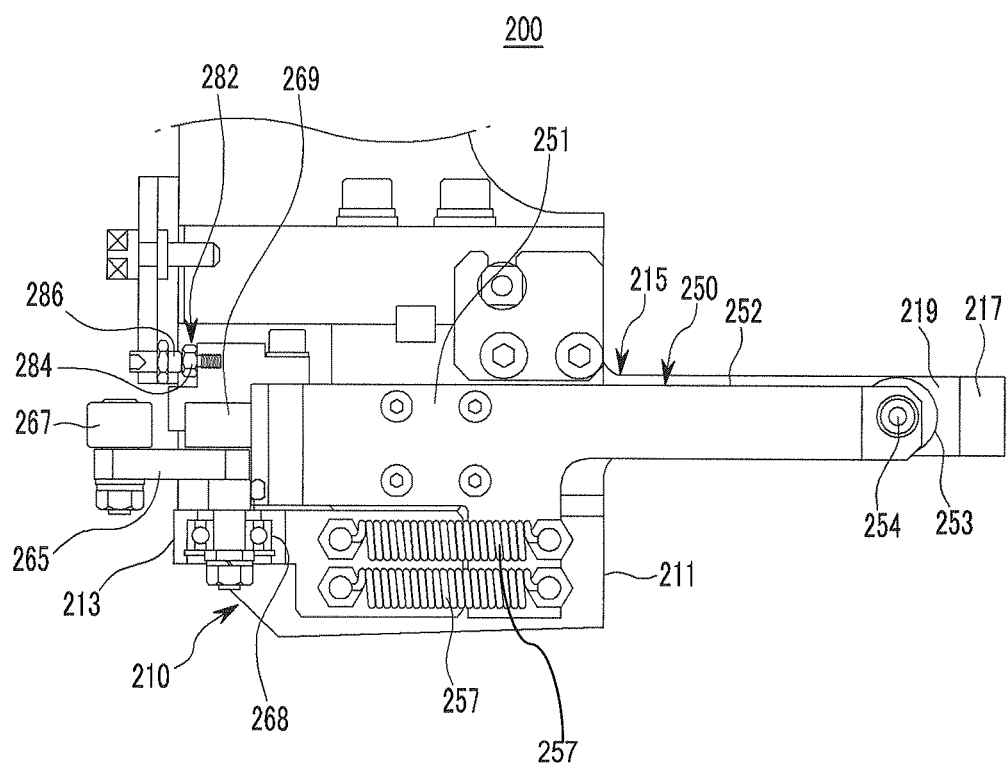
FIG. 3 is a plan view of the substrate centering device of FIG. 2.

FIG. 2 is a front view of a substrate centering device 200 for the organic material deposition system constructed as an exemplary embodiment, and FIG. 3 is a plan view of the substrate centering device 200 of FIG. 2.

With reference to FIGS. 2 and 3, the substrate centering devices 200 for the organic material deposition system constructed as an exemplary embodiment are formed at both side portions of the substrate 20 (see FIG. 1) such that the substrate centering devices 200 correspond to the substrate fixing holder 50 (see FIG. 1) within the organic material deposition chamber 10 (see FIG. 1).

Each of the substrate centering devices 200 for the organic material deposition system includes a substrate support holder 210, a substrate centering unit 250, and a substrate clamper 290. These elements will be described as follows.

Figure 9:
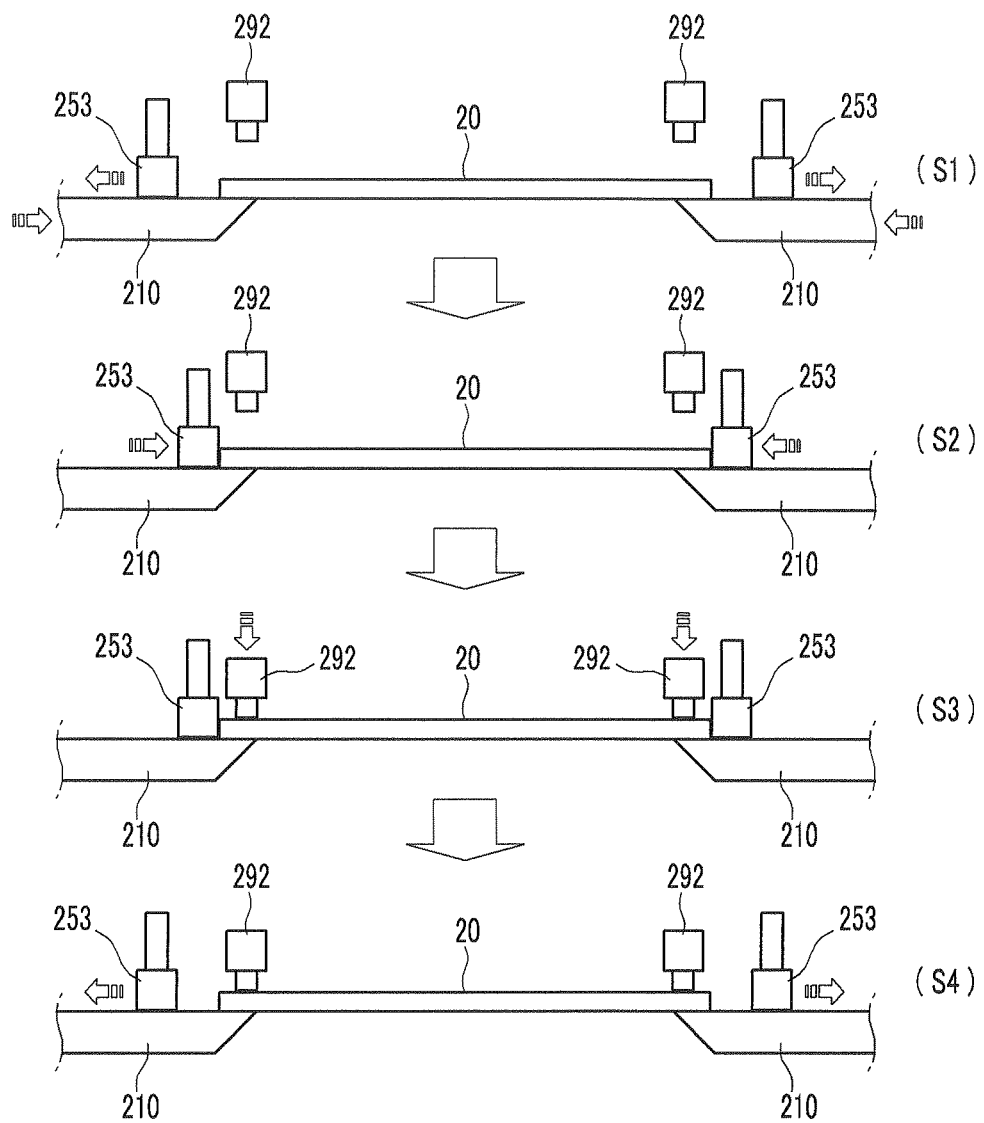
FIG. 9 illustrates the sequential process of the operation of the substrate centering device for the organic material deposition system constructed as an exemplary embodiment.

In the present exemplary embodiment, the substrate support holder 210 supports both side portions of the glass substrate 20 loaded into the organic material deposition chamber 10 by means of the robot (not shown). The substrate support holder 210 may support both side portions of the glass substrate 20 as shown in FIG. 9. Here, a plurality of substrate support holders 210 are provided within the organic material deposition chamber 10. Specifically, the plurality of substrate support holders 210 are formed at the corners of the glass substrate 20 that has been moved to a pre-set location within the organic material deposition chamber 10 according to teaching of the robot.

A pair of substrate support holders 210 of a pair of the substrate centering devices 200 may be provided at left and right sides of the organic material deposition chamber 10 based on FIG. 1, and are formed to be reciprocally movable forward and backward at a point of view of the left side or the right side of the organic material deposition chamber 10. The pair of substrate support holders 210 may be movable toward each other or away from each other. When the substrate support holders 210 move toward the substrate 20, the substrate support holders 210 perform a forward movement. When the substrate support holders 210 move away from the substrate 20, the substrate support holders 210 perform a backward movement.

In this case, in consideration of the fact that the substrate support holders 210 are reciprocally moved in a facing direction, i.e., at a point of view of the left side or the right side of the organic material deposition chamber 10, it is naturally understood that the substrate support holders 210 are reciprocally moved in the left and right directions D1 and D2 in view of FIG. 1. In this case, in consideration of the fact that the substrate support holders 210 may move forward and backward in the horizontal direction in a point of view of the left side or the right side of the organic material deposition chamber 10, such reciprocal movement of the substrate support holders 210 will be defined as a forward/backward movement. When the substrate support holders 210 reciprocally moves in the facing direction, the substrate support holders 210 moves toward or away from the substrate in a horizontal direction with respect to the substrate 20.

Each of the substrate support holders 210 includes a main body 211, a sub-body 213 fixed at an upper side 212 of the main body 211, and a holder body 215 disposed between the main body 211 and the sub-body 213.

The main body 211, the sub-body 213, and the holder body 215 are coupled by bolts or the like, and the holder body 215 is formed to be protruded with a certain length L from the main body 211 toward both side portions of the glass substrate 20 between the main body 211 and the sub-body 213.

The holder body 215 includes support portions 217 formed at an end of the protruded portion and the support portions 217 support both side portions of the glass substrate 20, and a slip region 219 formed as a recess stepped from the support portion 217.

Figure 4:
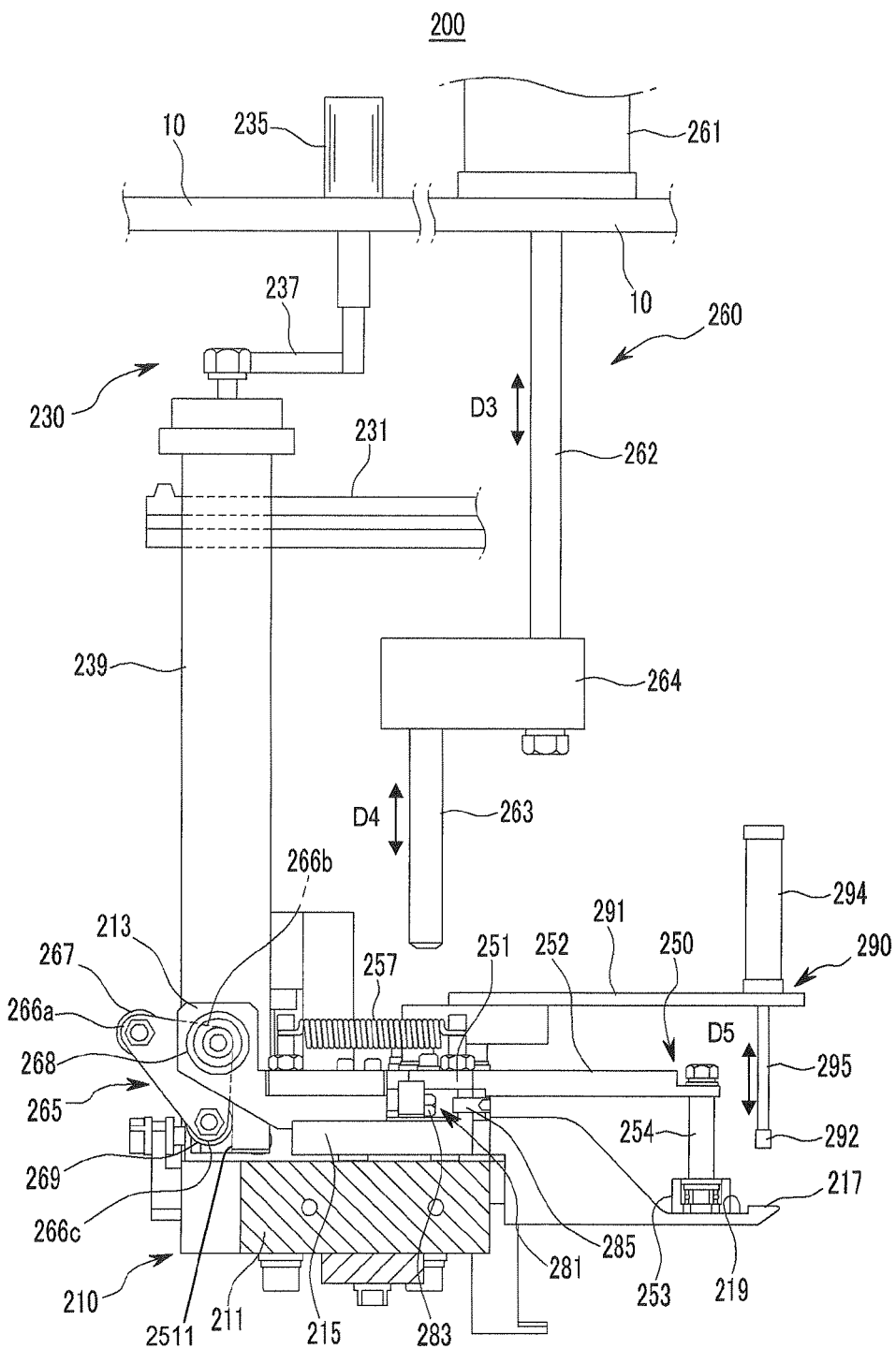
FIGS. 4 and 5 are schematic views schematically showing a driving unit and an operating unit employed for the substrate centering device for the organic material deposition system constructed as an exemplary embodiment.
Figure 5:
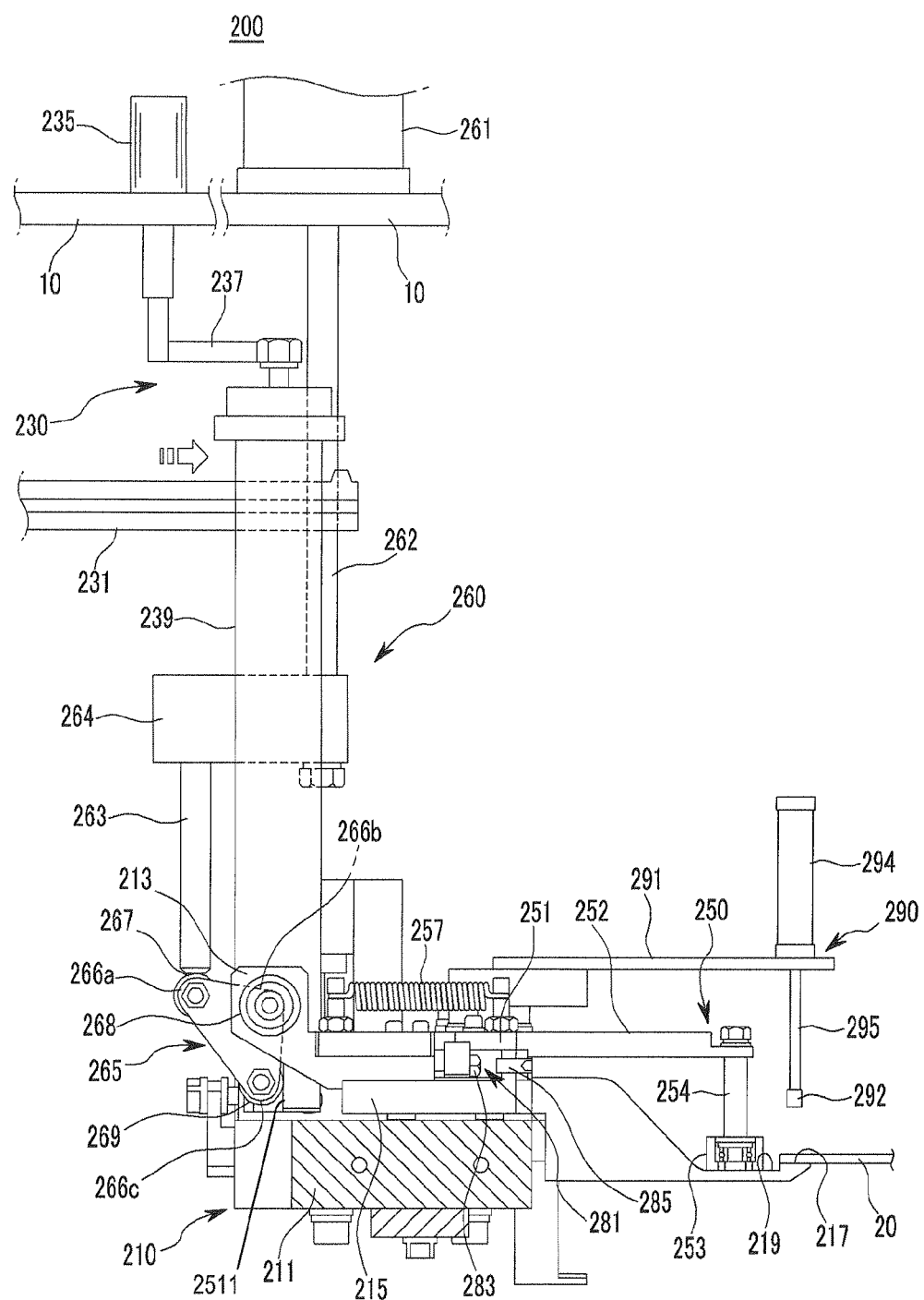

Meanwhile, the substrate centering device 200 constructed as an exemplary embodiment includes a driving unit 230 for reciprocally moving the substrate support holders 210 forward and backward, as shown in FIGS. 4 and 5.

In the present exemplary embodiment, the driving unit 230, which is configured to correspond to the substrate support holder 210 within the organic material deposition chamber 10, includes a guider 231 and a servo motor 235.

The guider 231, serving to guide a forward/backward reciprocal movement of the substrate support holder 210, is configured as a linear motion (L.M) guide that is widely used in the art, and is installed along the movement direction of the substrate support holder 210 within the organic material deposition chamber 10.

The servo motor 235 that provides driving power for the forward/backward reciprocal movement of the substrate support holder 210 is fixedly installed at a plate within the organic material deposition chamber 10, and generates forward/backward rotational driving power according to a control signal provided from a controller (not shown).

The servo motor 235 provides the rotational driving power to the substrate support holder 210 through a power transmission unit 237. The power transmission unit 237 includes a timing belt, a ball screw, and the like. The power transmission unit 237 has a structure for converting the rotational movement provided from the servo motor 235 into a linear movement to reciprocally move the substrate support holder 210 forward and backward.

Here, the power transmission unit 237 is configured as a power transmission device for a servo system that is widely known in the art, and is connected with a connection member 239 coupled to the guider 231 such that the connection member 239 is reciprocally slidably movable.

The connection member 239 has a rod form and is connected with the sub-body 213 of the substrate support holder 210.

In the present exemplary embodiment, the substrate centering unit 250 guides both side portions of the glass substrate 20 that has been loaded on the substrate support holder 210, and centers the glass substrate 20.

The substrate centering unit 250 that is configured to be reciprocally movable forward and backward with respect to the respective substrate support holders 210 includes a moving member 251, a roller member 253, and a return spring 257.

The moving member 251 is coupled with the sub-body 213 of the substrate support holder 210 such that the moving member 251 is reciprocally slidably movable along the movement direction of the substrate support holder 210.

Specifically, the moving member 251 is coupled with a guide rail (not shown) formed on an upper surface of the sub-body 213 such that it is reciprocally slidably movable, and an extending portion 252 is integrally formed with the moving member 251 such that it is parallel to the holder body 215 of the substrate support holder 210.

The roller member 253 substantially guides both side portions of the glass substrate 20 that has been loaded on the support portion 217 of the substrate support holder 210, and centers the glass substrate 20.

The roller member 253 is rotatably mounted on the extending portion 252 of the moving member 251, and is slidably disposed on the slip region 219 of the holder body 215 of the substrate support holder 210.

The roller member 253 is slidably moved on the slip region 219 of the holder body 215 as the moving member 251 is reciprocally moved forward and backward, and may be rollingly brought into a direct physical contact with both side portions of the glass substrate 20 supported by the support portion 217 of the holder body 217 or may be physically separated from and spaced apart from both side portions of the glass substrate 20.

Here, the roller member 253 is rotatably installed at a rotational shaft 254 fixed in a vertical direction toward the support portion 217 of the substrate support holder 210 at the end of the extending portion 252.

Namely, one end portion of the rotational shaft 254 is fixed to the extending portion 252 of the moving member 251, and the other end portion of the rotational shaft 254 has the roller member 253 rotatably mounted thereon.

The return spring 257 provides elastic force of restitution of the spring to the moving member 251 when the moving member 251 moves forward in order to return the moving member 251 back to its original location through the elastic force of restitution.

A pair of return springs 257 is provided as shown in FIG. 3, and is configured as tension springs installed to be connected with the sub-body 213 of the substrate support holder 210 and the moving member 251.

Namely, one end portion of each of the return springs 257 may be connected with the sub-body 213 through a bolt, and the other end portion of each of the return springs 257 may be connected with the moving member 251 through a bolt.

Meanwhile, the substrate centering unit 250 constructed as the present exemplary embodiment further includes a pair of stopper members 281 (as shown in FIG. 2) and 282 (as shown in FIG. 3) for limiting the forward/backward reciprocal movement distance of the moving member 251 with respect to the substrate support holder 210.

Among the pair of stopper members 281 and 282, one stopper member 281 (referred to as "first stopper member" hereinafter) as shown in FIG. 2 is installed at one side of the moving member 251 and serves to limit the forward movement distance of the moving member 251 with respect to the substrate support holder 210.

The first stopper member 281 is installed at a lower surface side of the moving member 251 and is stopped at a first stopper protrusion 285 provided to be protruded from the sub-body 213 of the substrate support holder 210. In other words, the first stopper member 281 defines the closest distance between the moving member 251 and the substrate 20.

Another stopper member 282 (referred to as "second stopper member" hereinafter) is installed at the other side of the moving member 251 in order to prevent the backward direction movement of the moving member 251. In other words, the second stopper member 282 defines the farthest distance between the moving member 251 and the substrate 20.

The second stopper member 282 is installed at an end portion of the opposite side of the extending portion 252 of the moving member 251 and is stopped by a second stopper protrusion 286 formed to be protruded from the sub-body 213 of the substrate support holder 210.

Here, preferably, the first and second stopper members 281 and 282 are provided as stopper bolts 283 and 284 that can adjust an operational stroke of the moving member 251 in a bolt manner.

Meanwhile, as shown in FIGS. 4 and 5, the substrate centering device 200 constructed as an exemplary embodiment includes an operation unit 260 for reciprocally moving the moving member 251 of each substrate centering unit 250 forward and backward in a state that each substrate support holder 210 advances forward along the guider 231 by the driving unit 230.

In the present exemplary embodiment, the operation unit 260, configured at the substrate support holder 210 and the organic material deposition chamber 10. The operation unit 260 includes an operation cylinder 261 formed on the organic material deposition chamber 10, a pressure member 263 formed at the operation cylinder 261, and a cam link 265 formed at the substrate support holder 210.

The operation cylinder 261 is fixedly installed on a plate in a vertical direction outside the organic material deposition chamber 10, and is configured as a pneumatic cylinder having an operation rod 262 moving forward and backward by pneumatic pressure.

The pressure member 263 is installed to be connected with the operation rod 262 of the operation cylinder 261 through a connection bracket 264, and has a bar form fixed in a vertical direction D4 to the connection bracket 264.

In this case, the pressure member 263 is reciprocally moved along the vertical direction D4 as the operation rod 262 of the operation cylinder 261 operates forward and backward in the vertical direction D3.

The connection bracket 264 is coupled to a guide rail (not shown) installed in the organic material deposition chamber 10 such that it is reciprocally slidably movable, in order to stably reciprocally move the pressure member 263.

The cam link 265 is rotatably mounted on the sub-body 213 of the substrate support holder 210 such that it corresponds to the moving member 251 of the substrate centering unit 250.

The cam link 265 is pressurized by the pressure member 263 according to the operation of the operation cylinder 261, and is configured to be cam-contacted with an end portion of the moving member 251.

In detail, the cam link 265 is configured as a substantially triangular plate cam, and includes first through third lobes 266a, 266b, and 266c formed as cam protrusions.

Here, the first lobe 266a is a portion pressurized by the pressure member 263 according to a forward operation of the operation rod 262 of the operation cylinder 261, where a first rotary roller 267, with which the pressure member 263 may be brought into contact with the first rotary roller 267 as shown in FIG. 5, is installed.

The second lobe 266b is a portion rotatably connected with the sub-body 213 of the substrate support holder 210. In this case, the second lobe 266b is rotatably connected with the sub-body 213 through a bearing 268.

The third lobe 266c is a portion that is brought into cam-contact with the end portion of the moving member 251, namely, the end portion of the opposite side of the extending portion 252. A second rotary roller 269, which may be brought into contact with the end portion 2511 of the moving member 251, is installed on the third lobe 266c. The second rotary roller 269 may be brought in a direct physical contact with the end portion 2511 of the moving member 251.

In the present exemplary embodiment, the substrate clamper 290 may clamp the glass substrate 20 that has been centered by the substrate centering unit 250 at the substrate support holder 210.

The substrate clamper 290, configured to be connected with each the substrate support holders 210 through mounting brackets 291, includes a clamping pin 292 that can be reciprocally movable in a vertical direction D5 from a location corresponding to the support portion 217 of the substrate support holder 210.

The clamping pin 292 may be loaded to the support portion 217 of the substrate support holder 210, and clamps both side portions of the glass substrate 20 that has been centered by the substrate centering unit 250.

The clamping pin 292 is configured to be reciprocally movable in the vertical direction D5 through a driving cylinder 294. In this case, the clamping pin 292 is coupled with a front end of an operation rod 295 of the driving cylinder 294, and the driving cylinder 294 is fixedly mounted on the mounting bracket 291.

The operation of the organic material deposition system 100 configured as described above constructed as an exemplary embodiment will now be described in detail with reference to the accompanying drawings.

As illustrated, in the present exemplary embodiment, the glass substrate 20 (see FIG. 1) is introduced to the interior of the organic material deposition chamber 10 through a transportation means such as the robot (not shown) and is then transported to a pre-set location within the organic material deposition chamber 10 in accordance with teaching of the robot.

Here, the mask 80 is fixed to the mask holder 70, and each substrate support holder 210 is in a state of having been moved backward along the guider 231 by the servo motor 235 of the driving unit 230, as shown in FIG. 4.

In the case of backward movement of the substrate support holder 210, the pressure member 263 of the operation unit 260 is in a state of having been moved backward in the upward direction toward the operation cylinder 261 in accordance with a backward operation of the operation rod 262 of the operation cylinder 261, and the clamping pin 292 of the substrate clamper 290 is in a state of having been moved backward in the upward direction toward the driving cylinder 294 in accordance with a backward operation of the operation rod 295 of the driving cylinder 294.

Also, as shown in FIGS. 2 and 4, the moving member 251 of the substrate centering unit 250 is in a state of having been moved backward with respect to each substrate support holder 210, where the moving member 251 has been moved away from the substrate 20. The roller member 253 is also in a state of having been moved backward at the slip region 219 of the substrate support holder 210 in accordance with the backward movement of the moving member 251, where the roller member 253 has been moved away from the substrate 20.

At this time, as shown in FIG. 3, the moving member 251 is in a state of having been moved backward by a pre-set movement distance as the second stopper member 282 was stopped by the second stopper protrusion 286.

In this state, as shown in FIG. 5, each substrate support holder 210 moves forward toward both side portions of the glass substrate 20 along the guider 231 according to the operation of the servo motor 235 of the driving unit 230.

Figure 6:
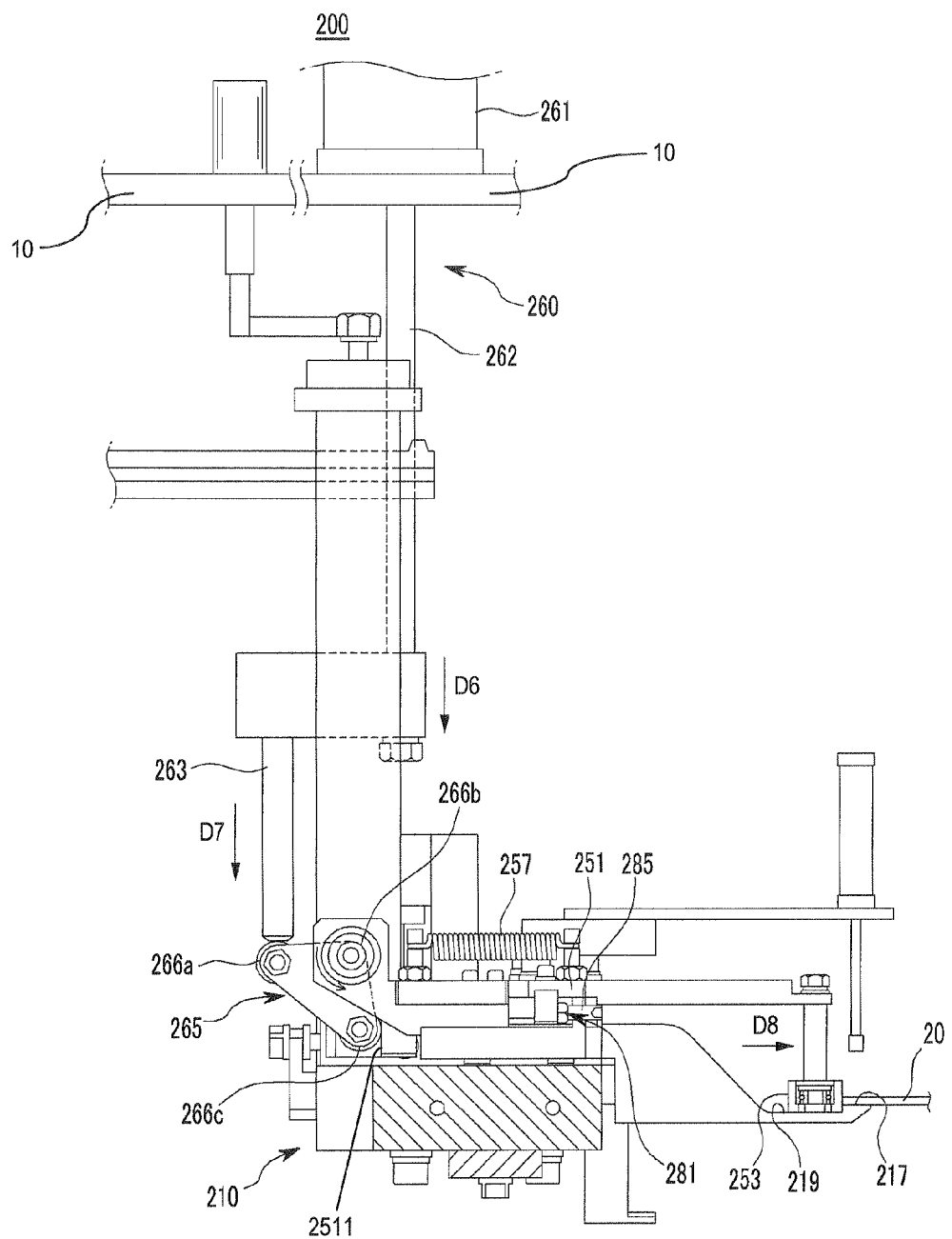
FIGS. 6 through 8 are views for showing an operational process of the substrate centering device for the organic material deposition system constructed as an exemplary embodiment.
Figure 7:
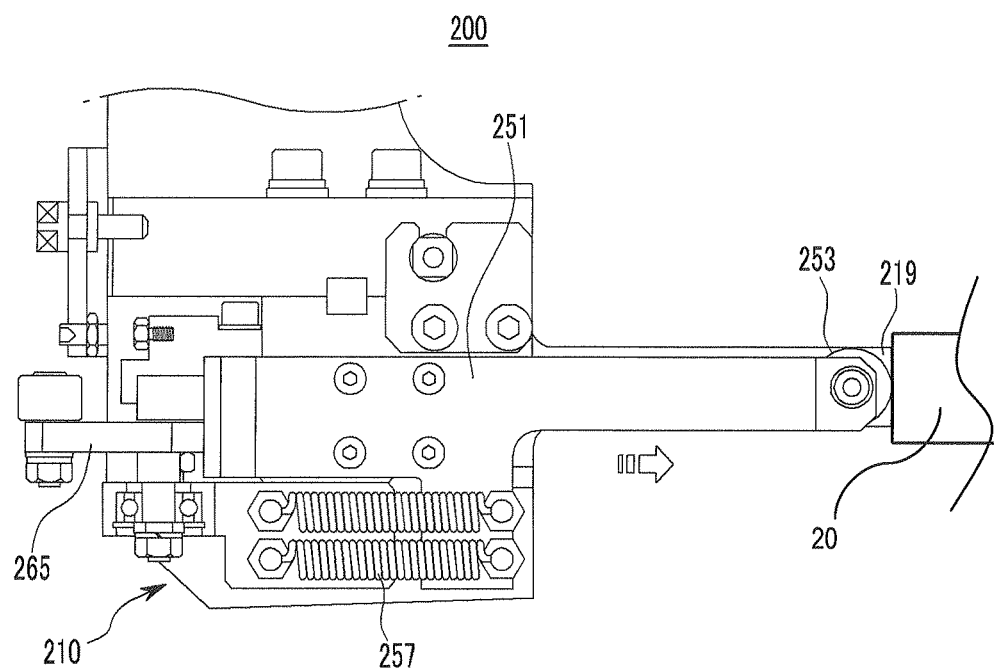
Figure 8:
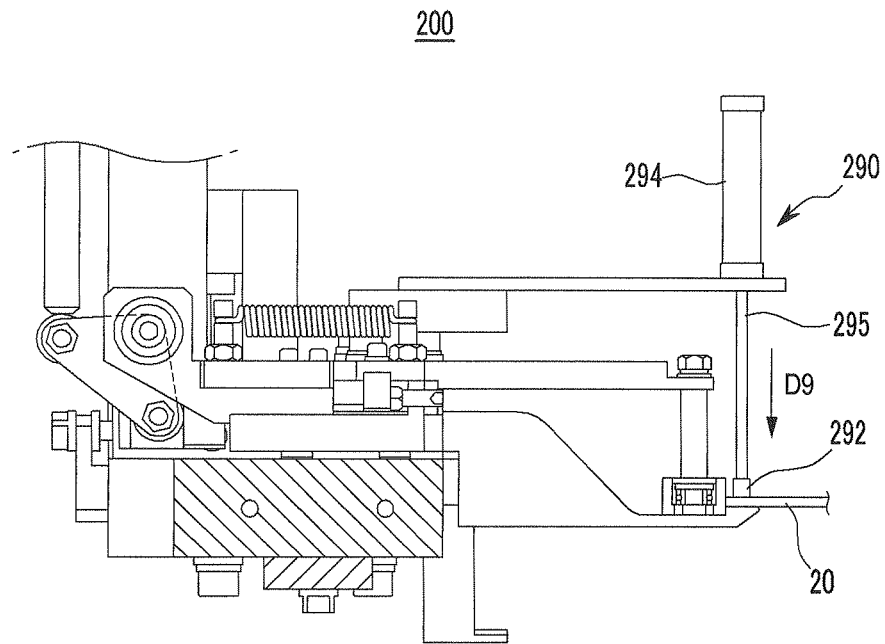

Now turning to FIGS. 6 through 8. The glass substrate 20 is then loaded to the support 217 (See FIG. 6) of the substrate support holder 210 by the robot (not shown) as shown in S1 of FIG. 9, and in this case, both side portions of the glass substrate 20 are mounted on the support portion 217 of the substrate support holder 210.

Next, in the state that each substrate support holder 210 has been moved forward, the operation cylinder 261 of the operation unit 260 is operated to lower the pressure member 263 as shown in FIGS. 6 and 7 according to the present exemplary embodiment.

Namely, when the operation rod 262 of the operation cylinder 261 is moved forward in the downward direction D6, the pressure member 263 connected with the operation rod 262 is moved in the downward direction D7.

Accordingly, the pressure member 263 pressurizes the first lobe 266a of the cam link 265, and accordingly, the cam link 265 is rotated counterclockwise centering around the second lobe 266b.

Then, the third lobe 266c of the cam link 265 pressurizes the end portion 2511 of the moving member 251, while moving the moving member 251 forward to both side portions of the glass substrate 20.

Here, as the first stopper member 281 is stopped by the first stopper protrusion 285, the moving member 251 moves forward (i.e., moves toward the substrate 20) by a pre-set movement distance.

Further, the return spring 257 is tensioned along a lengthwise direction L as shown in FIG. 2 according to the forward movement of the moving member 251, and provides an elastic force of restitution that is generated at this time to the moving member 251.

Accordingly, as the moving member 251 moves forward with respect to each substrate support holder 210, the roller member 253 moves forward at the slip region 219 of the substrate support holder 210. In other words, when the moving member 251 moves toward the substrate 20, the roller member 253 moves toward the substrate 20.

The roller member 253 may be moved toward the substrate 20 along a direction of D8 as shown in FIG. 6 in order to be brought in contact with the both side portions of the substrate 20. The roller member 253 may be in direct physical contact with the both side portions of the substrate 20. Accordingly, the roller member 253 is rollingly brought into contact with both side portions of the glass substrate 20 that has been loaded on the support portion 217 of the substrate support holder 210, adjusting left and right centering of the glass substrate 20, while guiding both side portions to adjust, as shown in S2 of FIG. 9.

As shown in FIG. 7, the substrate support holder 210 is moved toward the substrate 20. The position of the substrate 20 may be adjusted by the movement of the roller member 253.

After undergoing the above mentioned processes, the clamping pin 292 of the substrate clamper 290 moves forward in the downward direction as shown in S3 of FIG. 9 according to the forward operation of the operation rod 295 of the driving cylinder 294 in the downward direction D9 as shown in FIG. 8, clamping both side portions of the glass substrate 20.

In a state that the clamping of the glass substrate 20 by the substrate clamper 290 is completed, the aforementioned operation rod 262 of the operation cylinder 261 moves backward in the upward direction as shown in FIG. 5.

Then, the pressure member 263 connected with the operation rod 262 moves backward in the upward direction and the pressurizing force of the pressure member 263 applied to the first lobe 266a of the cam link 265 is released, and accordingly, the moving member 251 moves backward to its original location as shown in S4 of FIG. 9 by the elastic force of restitution of the return spring 257.

Namely, pushing the third lobe 266c of the cam link 265 by virtue of the elastic force of restitution of the return spring 257 to rotate the cam link 265 clockwise, the moving member 251 is returned to its original location.

Thus, in the present exemplary embodiment, in the state that the left and right sides of the glass substrate 20 are centered through the sequential operational processes as described above, the glass substrate 20 is fixed to the substrate fixing holder 50 and the location of the glass substrate 20 is aligned through the shaft 60.

Finally, in the present exemplary embodiment, the mask holder 70 is moved toward the substrate fixing holder 50, the glass substrate 20 and the mask 80 are coupled by means of the magnet plate 40, and the organic material is then evaporated by the heat evaporation source 90 to form a certain organic thin film pattern on the glass substrate 20.

As described above, in the organic material deposition system 100 constructed as the exemplary embodiment, in left and right centering of the glass substrate 20 that has been loaded on the substrate support holder 210, the moving member 251 of the substrate centering unit 250 is moved backward to sufficiently secure the space between the glass substrate 20 and the roller member 253, and then the glass substrate 20 is centered left and right while moving the roller member 253 forward.

Accordingly, in the present exemplary embodiment, even if the teaching adjustment by the robot is not precisely performed or even if the loaded location of the glass substrate 20 on the substrate support holder 210 is changed due to an external force, because the roller member 253 has been moved backward by the moving member 251, the occurrence of a collision between the roller member 253 and the glass substrate 20 may be prevented.

Namely, in the present exemplary embodiment, damage to the glass substrate 20 due to a collision between the roller member 253 and the glass substrate 20 that is possibly caused as the loaded location of the glass substrate 20 is changed may be prevented.

Also, in the present exemplary embodiment, the occurrence of a phenomenon that the glass substrate 20 gets on the roller member 253 or the like when the loaded location of the glass substrate 20 is changed may be prevented, thus preventing damage to the glass substrate 20 according to a clamping operation of the substrate clamper 290.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition method, comprising steps of:
   loading a substrate on a substrate centering device within an organic material deposition chamber;
   adjusting a position of the substrate by the substrate centering device, the substrate centering device comprising a plurality of substrate support holders configured to be reciprocally movable in a facing direction within the organic material deposition chamber, a substrate centering unit configured to be reciprocally movable at each of the substrate support holders, and a plurality of substrate clampers configured to be reciprocally movable in a vertical direction at each of the substrate support holders, with movements of the substrate support holders and the substrate centering unit and the substrate clampers being independent of each other;
   fixing the adjusted substrate with a substrate fixing holder; and
   fixing, by a mask holder, a mask at a lower side of the substrate fixing holder.

2. The method of claim 1, wherein the substrate centering device comprises an operation unit configured at the substrate support holders and the organic material deposition chamber, and reciprocally moving the substrate centering unit.

3. The method of claim 1, wherein the substrate centering unit comprises:
   a moving member installed to be reciprocally movable at the substrate support holders;

a roller member rotatably mounted on the moving member and rollingly brought into contact with both sides of the substrate; and at least one return spring installed to be connected with the substrate support holders and the moving member.

4. The method of claim 3, wherein the substrate centering unit comprises:

a pair of stopper members mounted on the moving member and limiting a reciprocal movement distance of the moving member with respect to the substrate support holders.

5. The method of claim 3, wherein an operation unit for reciprocally moving the substrate centering unit is provided at the substrate support holders and the organic material deposition chamber, and the operation unit comprises:

an operation cylinder mounted in a vertical direction in the organic material deposition chamber;

a pressure member installed to be connected with an operation rod of the operation cylinder; and a cam link rotatably installed on the substrate support holders, pressurized by the pressure member according to an operation of the operation cylinder, and the cam link brought into contact with the moving member according to the operation of the operation cylinder.

6. A deposition method, comprising:

pre-loading a substrate on a substrate centering device within an organic material deposition chamber;

adjusting a position of the pre-loaded substrate by the substrate centering device, the substrate centering device comprising a plurality of substrate support holders supporting end portions of the substrate and being reciprocally movable toward and away from the substrate in a horizontal direction with respect to the substrate, a substrate centering unit extending from each of the substrate support holders toward the substrate and being reciprocally movable toward and away from the substrate in the horizontal direction with respect to the substrate, and a plurality of substrate clampers connected with the substrate support holders and being reciprocally movable in a vertical direction with respect to the substrate, with movements of the substrate support holders and the substrate centering unit and the substrate clampers being independent of each other;

holding the adjusted substrate by a substrate fixing holder disposed within the organic material deposition chamber; and holding, by a mask holder disposed within the organic material deposition chamber, a mask below the substrate fixing holder, with the mask holder vertically reciprocally moveable within the organic material deposition chamber.

7. The method of claim 6, wherein the substrate centering device comprises an operation unit disposed at the substrate support holders within the organic material deposition chamber, the substrate centering device reciprocally moving the substrate centering unit in the horizontal direction with respect to the substrate.

8. The method of claim 6, further comprising:

reciprocally moving the substrate support holders by a driving unit in the horizontal direction with respect to the substrate.

9. The method of claim 6, wherein each of the substrate clampers further comprises a roller member being in immediate physical contact with the substrate.

10. A method for positioning a substrate, comprising steps of:

pre-loading the substrate on a plurality of substrate support holders by moving the plurality of substrate support holders in a facing direction;

adjusting a position of the substrate by moving a substrate centering unit toward the substrate at each of the substrate support holders; and clamping the substrate by moving a plurality of substrate clampers in a vertical direction toward the substrate at each of the substrate support holders, with the movements of the plurality of substrate support holders and the substrate centering unit and the plurality of substrate clampers being independent of each other.

11. The method of claim 10, further comprising step of:

after clamping the substrate, moving the substrate centering unit away from the substrate at each of the substrate support holders.

12. The method of claim 10, wherein during the step of pre-loading the substrate, moving the substrate centering unit away from the substrate at each of the substrate support holders.

13. The method of claim 10, wherein during the step of pre-loading the substrate, the plurality of substrate support holders brought into contact with a bottom of the substrate.

14. The method of claim 10, wherein during the step of adjusting the position of the substrate, the substrate centering unit brought into contact with a periphery of the substrate.

15. The method of claim 10, wherein during the step of clamping the substrate, the plurality of substrate clampers brought into contact with a top of the substrate.

* * * * *